(12) United States Patent
Lefevre

(10) Patent No.: US 11,632,040 B2
(45) Date of Patent: Apr. 18, 2023

(54) SWITCH DRIVER POWERING CIRCUIT

(71) Applicant: Commissariat à l'Énergie Atomique et aux Énergies Alternatives, Paris (FR)

(72) Inventor: Guillaume Lefevre, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 262 days.

(21) Appl. No.: 16/688,862

(22) Filed: Nov. 19, 2019

(65) Prior Publication Data

US 2020/0161963 A1 May 21, 2020

(30) Foreign Application Priority Data

Nov. 20, 2018 (FR) ...................... 1871635

(51) Int. Cl.
*H02M 1/44* (2007.01)
*H02M 7/537* (2006.01)
*H02M 1/00* (2006.01)
*H02M 1/088* (2006.01)

(52) U.S. Cl.
CPC ............ *H02M 1/44* (2013.01); *H02M 7/537* (2013.01); *H02M 1/0006* (2021.05); *H02M 1/088* (2013.01)

(58) Field of Classification Search
CPC ...... H02M 1/0006; H02M 1/08; H02M 1/088; H02M 1/44; H02M 3/156; H02M 3/158; H02M 7/537; H02M 7/5387; H03K 17/063; H03K 17/6874
See application file for complete search history.

(56) References Cited

U.S. PATENT DOCUMENTS

| | | | | |
|---|---|---|---|---|
| 6,304,137 B1 * | 10/2001 | Pullen | ..................... | H02M 1/44 330/10 |
| 6,643,144 B2 | 11/2003 | Feldtkeller | | |
| 6,707,257 B2 * | 3/2004 | Norris | ................ | A61B 5/14552 345/82 |
| 2009/0295503 A1 * | 12/2009 | Harada | ................ | H03H 7/0153 333/174 |
| 2012/0187934 A1 * | 7/2012 | Suzuki | .................. | H02M 3/156 323/311 |
| 2017/0098997 A1 * | 4/2017 | Hamada | ................ | H01F 1/0306 |

FOREIGN PATENT DOCUMENTS

| | | | | |
|---|---|---|---|---|
| CN | 204442157 | * | 12/2014 | ............ H02M 1/088 |
| DE | 4225410 C1 | * | 1/1994 | ............ H02M 3/156 |
| GB | 2 324 664 A | | 10/1998 | |
| WO | WO 01/52396 A2 | | 7/2001 | |

OTHER PUBLICATIONS

Preliminary Search Report for French Application No. 1871635, dated Sep. 11, 2019.

(Continued)

*Primary Examiner* — Matthew V Nguyen
(74) *Attorney, Agent, or Firm* — Wolf, Greenfield & Sacks, P.C.

(57) ABSTRACT

An assembly for powering a first circuit, including at least one ferrite bead in series with a diode between a first terminal of application of a first voltage and a first terminal of said first circuit.

6 Claims, 5 Drawing Sheets

(56) References Cited

OTHER PUBLICATIONS

[No Author Listed] DRV421 Integrated magnetic fluxgate sensor for closed-loop current sensing. Texas Instruments. May 2015:1-44.
Josifović et al., Improving SiC JFET switching behavior under influence of circuit parasitics. IEEE Transactions on Power Electronics. Jan. 25, 2012;27(8):3843-54.
Josifović et al., SiC JFET switching behavior in a drive inverter under influence of circuit parasitics. 8th International Conference on Power Electronics—ECCE Asia. May 30, 2011:1087-94.
Yin et al., Experimental comparison of high-speed gate driver design for 1.2-kV/120-A Si IGBT and SiC MOSFET modules. IET Power Electronics. Jul. 2017;10(9):979-86.

\* cited by examiner

SWITCH DRIVER POWERING CIRCUIT

This application claims priority to French patent application number 18/71635, the content of which is hereby incorporated by reference in its entirety to the maximum extent allowable by law.

TECHNICAL BACKGROUND

The present disclosure generally concerns electronic circuits and more particularly bootstrapping techniques for switches made in MOS technology. The present disclosure more particularly concerns power switch driver powering techniques. The present disclosure more particularly applies to current and voltage inverters.

PRIOR ART

Inverters are particularly widespread. They have further increasingly developed with the outbreak of photovoltaic installations.

Current inverters are generally based on the use of MOS power transistors in series between terminals of application of an AC voltage and cyclically controlled. The control requires powering drivers of these transistors from variable or floating potentials. This generally results in providing galvanic isolation elements, which increases the cost of the solution.

Document WO-A-0152396 describes a boost power converter based on an inductive power storage element.

Document GB-A-2324664 describes a circuit of protection against negative voltage defects.

SUMMARY

There is a need to improve power switch driver powering circuits, in particular, in applications to "inverters".

An embodiment overcomes all or part of the disadvantages of circuits for powering drivers of MOS power switches in series having common N-type sources.

An embodiment provides a solution which is particularly simple and inexpensive as compared with current solutions.

An embodiment provides an assembly for powering a first circuit, comprising at least one ferrite bead in series with a diode between a first terminal of application of a first voltage and a first terminal of said first circuit.

According to an embodiment, at least one capacitor couples said first terminal of the first circuit to a second terminal of the first circuit.

According to an embodiment, the first voltage is delivered by a voltage source.

According to an embodiment, the assembly forms a bootstrap assembly.

According to an embodiment, the assembly further comprises a resistor in series with the ferrite bead and the diode.

An embodiment provides a circuit for delivering power supply voltages to a first circuit and to a second circuit, comprising:
  a source of a voltage for powering the second circuit;
  at least one assembly such as described for powering the first circuit.

According to an embodiment, a second terminal of the voltage source is coupled, preferably connected, to a second terminal of the second circuit.

According to an embodiment, the first circuit and the second circuit are respective drivers of a first switch and of a second switch in series, the respective second terminals of the first circuit and of the second circuit being coupled, preferably connected, to respective conduction terminals of the first switch and of the second switch.

According to an embodiment, said ferrite bead is selected to have a resonance frequency of the same order of magnitude as the switching frequency of the first and second switches.

According to an embodiment, the switches are voltage-controlled switches.

According to an embodiment, the switches are N-channel MOS transistors assembled with a common source.

An embodiment provides a switch comprising:
  a first switch and a second switch in series between a first terminal and a second terminal;
  a first driver of the first switch and a second driver of the second switch;
  at least one first source of a voltage for powering the second driver; and
  at least one first power supply assembly.

According to an embodiment, the switch further comprises:
  a second voltage source in series with the first voltage source, the second driver being powered by the two voltage sources in series; and
  a second power supply assembly between a terminal of the second voltage source and a terminal of the first driver.

An embodiment provides a current inverter comprising six switches such as described, series-coupled in pairs of switches, the pairs of switches being in parallel between two input terminals of the inverter.

An embodiment provides a voltage inverter comprising switches such as described.

The foregoing and other features and advantages will be discussed in detail in the following non-limiting description of specific embodiments in connection with the accompanying drawings.

DESCRIPTION OF THE EMBODIMENTS

Figure 1:
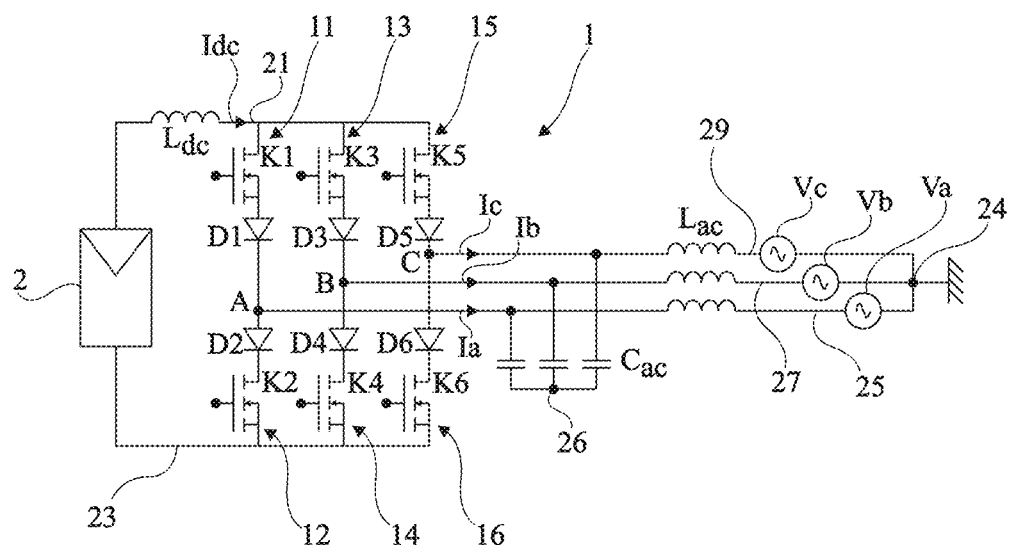
FIG. 1 very schematically shows an example of a usual current inverter.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the generation of the pulse frequency or width modulation control signals for controlling the power switches has not been detailed, the described embodiments being compatible with usual techniques for generating such signals. Similarly, the use of the power transferred by the power switches which are controlled by circuits powered by the described embodiments has not been detailed, the described embodiments being here again compatible with current uses.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

For simplification, the described embodiments take as an example an application to a current inverter. It should however be noted that these embodiments transpose to a voltage inverter and more generally to the powering of drivers of switches in series.

FIG. 1 very schematically shows an example of a usual current inverter. In the example of FIG. 1, the case of a three-phase inverter is considered.

A current inverter 1 of the type illustrated in FIG. 1 is based on six switches 11, 12, 13, 14, 15, and 16. The switches are arranged in series, two by two, between terminals 21 and 23, to form three parallel branches of two switches 11-12, 13-14, and 15-16 in series. A voltage source 2 in series with an inductance Ldc is coupled between terminals 21 and 23. Switches 11 to 16 are controlled to be conductive two by two (at each cycle, a high switch 11, 12, or 13 of a branch with a low switch 12, 14, 16 of another branch) to divide the DC current Idc flowing into terminal 21 into three AC currents 1a, 1b, 1c on the respective junction points A, B, and C of the pairs of switches 11-12, 13-14, and 15-16. Each terminal A, B, C is coupled, by an inductance Lac, to a terminal, respectively 25, 27, 29, for supplying an AC voltage Va, Vb, Vc relative to ground 24 or neutral N of the AC power supply. Each terminal A, B, C is further coupled by a capacitor Cac to a common node 26 (star connection) such as shown in FIG. 1, or to another one of terminals A, B, and C (delta connection, not shown).

The operation of a current inverter is usual and will not be detailed.

In the structure of FIG. 1, each switch is formed of a controllable switch K1, K2, K3, K4, K5, K6 (typically a MOS transistor) in series with a diode D1, D2, D3, D4, D5, D6. The function of diodes D1 to D6 is to make each switch bidirectional for the voltage (the MOS or IGBT transistor K blocks a positive voltage, the associated diode D blocks a negative voltage and a current flows through the two components when transistor K is on and diode D is forward-biased).

In certain applications, typically applications at low power (smaller than a few tens of kilowatts), the series resistance of the diodes in the conductive state generates losses and voltage drops across the diodes, which adversely affect the efficiency of the inverter.

Figure 2:
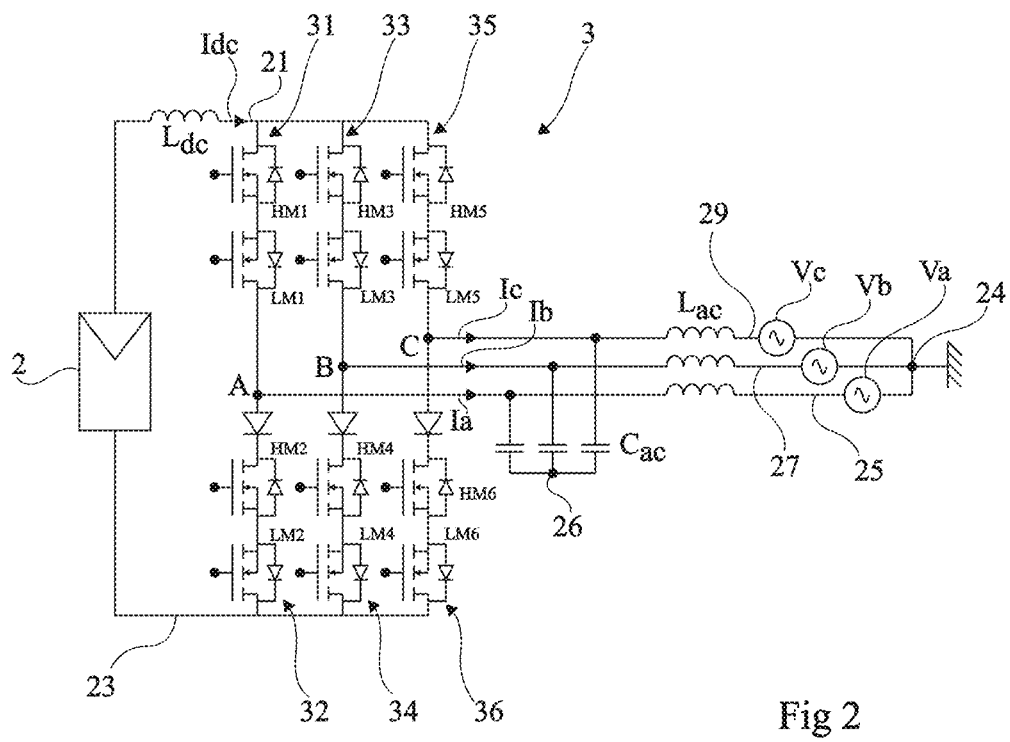
FIG. 2 very schematically shows an embodiment of a current inverter of the type to which the described embodiments apply as an example.

FIG. 2 very schematically shows an embodiment of a current inverter 3 of the type to which the described embodiments apply as an example. In the example of FIG. 2, the case of a three-phase inverter is also considered.

The general architecture of the inverter is similar to that of the inverter of FIG. 1. It comprises six switches 31, 32, 33, 34, 35, and 36 in series, two by two, between terminals 21 and 23 having a voltage source 2 coupled in series with an inductance Ldc therebetween. It also comprises inductances Lac coupling the junction points A, B, and C of the pairs of switches 31-32, 33-34, and 35-36, to terminals 25, 27, and 29 for supplying AC voltages Va, Vb, Vc relative to ground 24 or neutral N of the AC power supply, and capacitors Cac coupling, in the shown example, terminals A, B, C to a common node 26.

However, in the embodiment of FIG. 2, the diodes are replaced with controllable switches (here, MOS transistors) to have much smaller on-state voltage drops (for example, smaller than 400 millivolts). This amounts to assembling head-to-tail, in each switch, two switches bidirectional for the current.

Thus, each switch comprises a high transistor HM1, HM2, HM3, HM4, HM5, HM6 in series with a low transistor, respectively LM1, LM2, LM3, LM4, LM5, LM6. As compared with the inverter of FIG. 1, the function of blocking the conduction of the intrinsic diodes of transistors HM1, HM3, HM5, HM2, HM4, and HM6 (representing the switches K1, K3, K5, K2, K4, and K6 of FIG. 1) is ensured by the respective turning off of transistors LM1, LM3, LM5, LM2, LM4, and LM6. FIG. 2 shows the intrinsic diodes of the different transistors.

A difficulty then lies in the power supply of the drivers of the high and low HM and LM transistors of a same switch. Indeed, an additional driver per switch should be provided since there are two transistors of same nature (they both typically have an N channel). Now, such a driver, although it is not complicated per se, requires being powered with respect to variable or floating potentials. In particular, considering N-channel transistors assembled head-to-tail, that is, with a common source, the drivers should be powered with a voltage having the source potential as a potential, which is thus floating.

Usual techniques use galvanic isolation circuits which are particularly expensive.

The solutions provided in the present description originate from a new approach, based on the use of a single power supply for two switches (MOS transistors) assembled head-to-tail or with a common source (for N-channel transistors).

It could have been devised to transpose a so-called bootstrap assembly technique based on a single power supply voltage source to power the drivers of the high and low MOS transistors. However, usual bootstrap assemblies are not adapted and do not optimally operate in an assembly of two MOS transistors head-to-tail.

Figure 3:
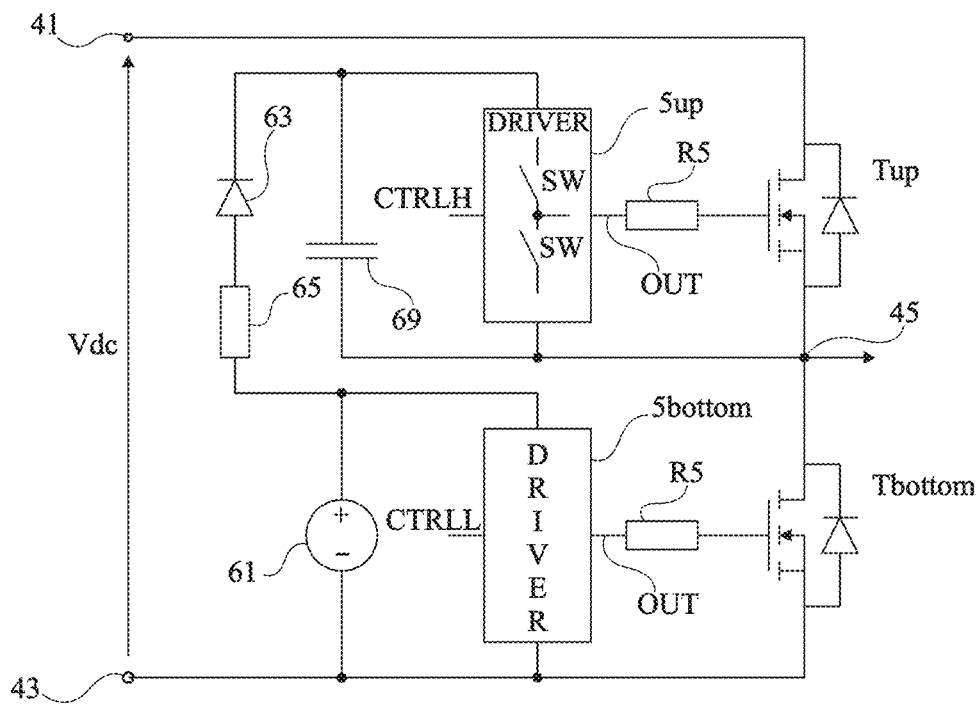
FIG. 3 shows an example of a usual bootstrap assembly.

FIG. 3 shows an example of a usual bootstrap assembly. This drawing illustrates the principle of a bootstrap assembly for powering drivers of an arm formed of two MOS transistors Tup and Tbottom in series between two terminals 41 and 43 of application of a DC voltage Vdc. The junction point 45 of the transistors forms an output terminal towards a load, not shown. The respective sources of transistors Tup and Tbottom are coupled to terminals 45 and 43. The control of each transistor Tup, Tbottom, is ensured by a driver 5up, respectively 5bottom, having an input terminal receiving a signal CTRLH, respectively CTRLL, and having an output terminal OUT coupled, by a resistor R5, called gate resistor, to the gate of transistor Tup, respectively Tbottom. Resistor R5 particularly enables to adjust the switching dynamics of the corresponding switch Tup or Tbottom and to decrease oscillations at the level of their respective gate. Typically, each circuit 5up, 5bottom, comprises a CMOS structure of two switches SW in series (see circuit 5up) having their junction point delivering a signal in all or nothing for controlling transistor Tup or Tbottom and having their gates receiving information representative of the associated control signal CTRLH or CTRLL. Control signals CTRLH and CTRLL should be generated to avoid any simultaneous conduction of transistors Tup and Tbottom which would result in shorting voltage source Vdc.

Since transistors Tup and Tbottom are N-channel MOS transistors, the signals OUT of circuits 5up and 5bottom should be respectively referenced to the potential of terminal 45 (for circuit 5up) and to the potential of terminal 43 (for circuit 5bottom). The principle of a bootstrap circuit is to power, with no galvanic isolation, a circuit at a floating potential from a power supply referenced to a fixed potential. For this purpose, a usual bootstrap circuit comprises a DC voltage source 61 referenced to terminal 43 directly powering circuit 5bottom and having its positive terminal coupled, by a diode 63 in series with a resistor 65, to a positive power supply terminal of circuit 5up. The positive power supply terminal is further coupled, by a capacitor 69, to output terminal 45. Voltage source 61 is generally a source of a low voltage (a few volts) compatible with the voltages that drivers 5up and 5bottom can withstand. Such a circuit operates since switches Tup and Tbottom are controlled not to be on at the same time.

Circuit 5bottom, associated with switch Tbottom, may be directly controlled by voltage source 61 since it has a reference common with the voltage source. On the side of circuit 5up, when switch Tbottom is on, voltage source 61 charges capacitor 69 positively with respect to terminal 45 and thus creates an auxiliary power supply for circuit 5up. Diode 63, conditioning the flow direction from source 61 to capacitor 69, avoids for capacitor 69 to discharge otherwise than so as to power circuit 5up. Diode 63 also enables to block the high voltage (Vdc plus the voltage across capacitor 69) which is present on its cathode when transistor Tbottom is off, and thus protects voltage source 61. Resistor 65 is used to limit current inrushes during the recharge of capacitor 69.

Such a bootstrap assembly is strongly dependent on the operating conditions and particularly on the duty cycle and on the frequency of signals CTRLH and CTRLL. Indeed, the charge of capacitor 69 is only performed during cycles when transistor Tbottom is on.

A bootstrap assembly such as illustrated in FIG. 3 thus cannot be transposed to the generation of power supply voltages for drivers of MOS switches of a current inverter such as illustrated in FIG. 2. More generally, such an assembly cannot be transposed to the control of MOS switches in series such that they are simultaneously off and on. In other words, it cannot be transposed to the power supply of drivers of two transistors with a common source in series between two potentials, including a variable potential (point A, B, or C in the example of FIG. 2).

Figure 4:
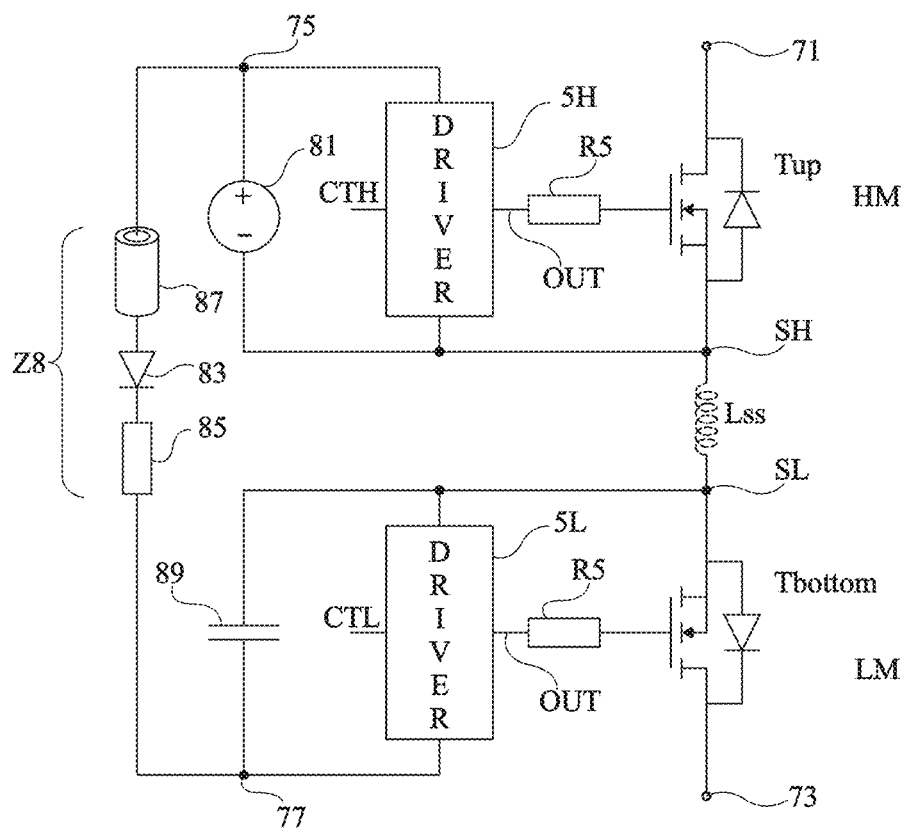
FIG. 4 shows an embodiment of a bootstrap assembly for generating power supply voltages of drivers of two transistors in series.

FIG. 4 shows an embodiment of a bootstrap assembly for generating power supply voltages of drivers of two transistors in series, assembled head-to-tail.

According to this embodiment, it is assumed that two switches HM and LM (typically MOS transistors, preferably with an N-channel, assembled with a common source) are coupled, preferably connected, between two terminals 71 and 73 of application of a voltage which varies over time. Taking the example of inverter 3 of FIG. 2, and according to the considered switch, terminal 71 is terminal 21 and terminal 73 is one of terminals A (switch 31), B (switch 33), and C (switch 35), or terminal 71 is one of terminals A (switch 32), B (switch 34), and C (switch 36) and terminal 73 is terminal 23.

Transistor HM is controlled by a circuit (DRIVER) 5H and transistor LM is controlled by a circuit (DRIVER) 5L, the output terminals OUTH and OUTL of circuits 5H and 5L being coupled, preferably by resistors R5, to the respective gates of transistors HM and LM. Each circuit 5H, 5L receives a control signal CTH, respectively CTL. It should be noted that unlike signals CTRLH and CTRLL of FIG. 3, which should be different for the two circuits 5up and 5bottom, signals CTH and CTL require no specific property, the switches being controlled at any time by their source. In FIG. 4, although the connection to one another of the sources of transistors HM and LM is preferably direct, a parasitic inductance Lss coupling the sources SH and SL of transistors HM and HL to each other has been illustrated (in dotted lines). Indeed, in the targeted applications, although the two transistors HM and LM are on at the same time, during switchings to turn them on or off, the parasitic inductance Lss of connection of the sources to each other is capable of generating a potential difference between sources SH and SL. Such induced voltages risk disturbing the operation.

According to the embodiment of FIG. 4, it is provided to power driver 5H from a DC voltage source 81 referenced to source SH of transistor HM. In other words, the most positive terminal+of source 81 is coupled, preferably connected, to terminal 75 of positive power supply of circuit 5H and the most negative terminal—of source 81 is coupled, preferably connected, to source SH of transistor HM, thus enabling to reference its gate control signal to the floating potential of terminal SH. Voltage source 81 is a source of a low voltage (a few volts) compatible with the voltage that driver circuit 5H can withstand.

Circuit 5L is powered by a capacitor 89 having its two electrodes coupled, preferably connected, to the power supply terminals of circuit 5L.

The power transfer from voltage source 81 to capacitor 89 is performed, according to the described embodiments, by an assembly Z8 having its impedance varying according to frequency. The function of this assembly is to transfer power from voltage source 81 to capacitor 89 with a specific frequency response in order to block voltages induced by inductance Lss. Assembly Z8 couples terminal 75 to the negative electrode of capacitor 89 (that coupled, preferably connected, to a terminal 77 of application of the most negative potential of the power supply voltage of circuit 5L). Assembly Z8 comprises, in series between terminals 75 and 77, a ferrite bead 87, a diode 83, and a resistor 85, the cathode of diode 83 being directed towards capacitor 89 to avoid its discharge into voltage source 81. Diode 83 takes part in protecting voltage source 81 by blocking (at least partially) negative voltages induced by inductance Lss. Resistor 85 enables to avoid overvoltages at the start. Indeed, as will better appear from the discussion of FIGS. 7 and 8, ferrite bead 87 behaves as an inductance at low frequencies. Without resistor 85, one would risk inducing overvoltages across capacitor 89, which might damage it. Resistance 85 may possibly being provided by the dynamic resistance of diode 83, which avoids a component.

The selection of a ferrite bead originates from a new analysis of the behavior of the respective sources SH and SL of transistors HM and HL during switchings, in particular during switchings to turn on transistors HM and HL. Indeed, during switchings, parasitic inductance Lss behaves as a current source and introduces a potential difference between sources SH and SL. This phenomenon is particularly present in applications targeted by the present disclosure where the switching speed is significant, for example, in the order of from 2 to 10 A/ns according to the equivalent frequency at which transistors HM and HL see the current variations (in the order of some hundred MHz).

One or a plurality of zener diodes may possibly be connected across capacitor 89 to protect it against possible overvoltages. The threshold of the zener diode(s) is then selected according to the power supply voltage desired for circuit 5L.

Figure 5:
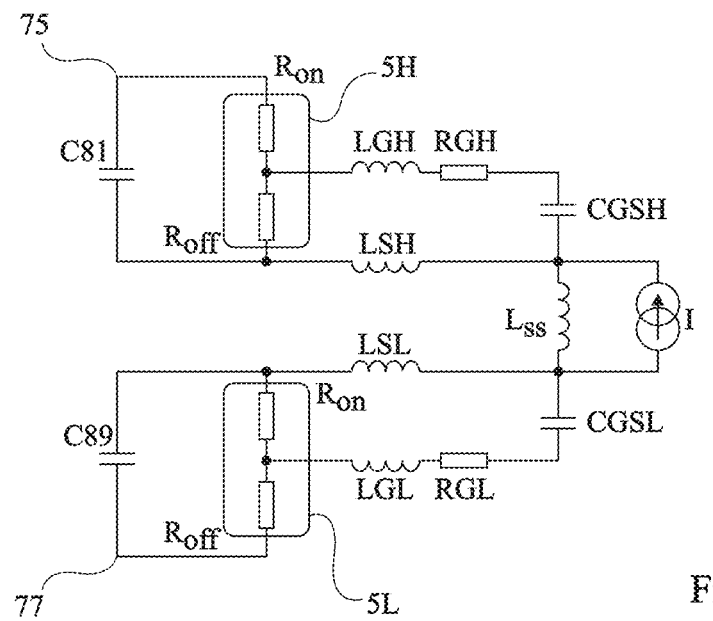
FIG. 5 schematically and partially shows a model of the assembly of FIG. 4.

FIG. 5 schematically and partially shows a model of the assembly of FIG. 4.

Figure 6:
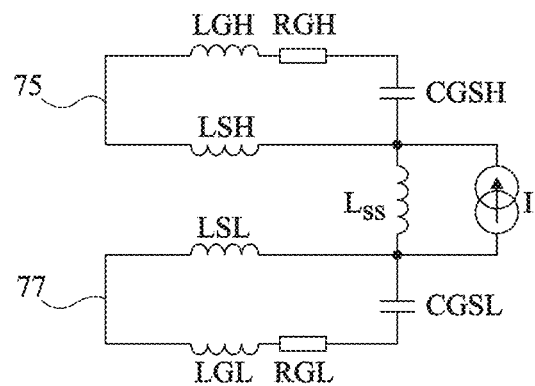
FIG. 6 schematically and partially shows another model of the assembly of FIG. 4.

FIG. 6 partially and schematically shows another model of the assembly of the drawing.

FIGS. 5 and 6 schematically show the respective intermediate (FIG. 5) and small signal (FIG. 6) models of the assembly of FIG. 4 without inductance Z8.

Starting from the diagram of FIG. 4, it can be considered (FIG. 5) that voltage source 81 and capacitor 89 are respectively equivalent to capacitors C81 and C89 in parallel with series associations of resistors Ron and Roff representing, for each driver 5H, 5L, the on-state and off-state resistances of its switches (SW, FIG. 3). The junction points of resistors Ron and Roff are coupled by respective parasitic inductances LGH and LGL, in series with (intrinsic) gate resistors RGH, respectively RGL, to the gates of transistors HM and LM. Each transistor HM, LM may be considered as a gate-source capacitor CGSH, respectively CGHL, between resistor RGH, respectively RGL, and the parasitic inductance Lss coupling the sources together. Further, capacitors 81 and 89 are respectively coupled across inductance Lss by inductances LSH and LSV. During switchings, parasitic inductance Lss can be considered as being in parallel with a dynamic current source I linked to the switching of the current of the inductance.

The diagram of FIG. 5 can be simplified, in small signals, in a model (FIG. 6) where the source electrodes of capacitors CGSH and CGSL are coupled by inductance Lss and current source I in parallel, and where each source electrode is coupled to the gate electrode of capacitor CGSH, respectively CGSL, concerned by the series association of inductance LSH, respectively LSL, of inductance LGH, respectively LGL, and of resistor RGH, respectively RGL.

It could have been devised to couple, directly or via a diode, terminals 75 and 77 to transfer power to capacitor 89. However, during a switching, the behavior of the gates of transistors HM and LM may be disturbed to such an extent that, for example, transistor LM is turned back on while it is desired to be blocked.

The fact of providing a ferrite bead 87 (FIG. 4) between terminals 75 and 77 enables, by appropriately sizing it, to isolate points 75 and 77 during switchings while allowing the flowing of a current from terminal 75 to terminal 77 when no switching occurs to supply the required power to capacitor 89.

Advantage is taken for this purpose of the frequency response of a ferrite bead, which behaves as a resistor around its resonance frequency.

Figure 7:
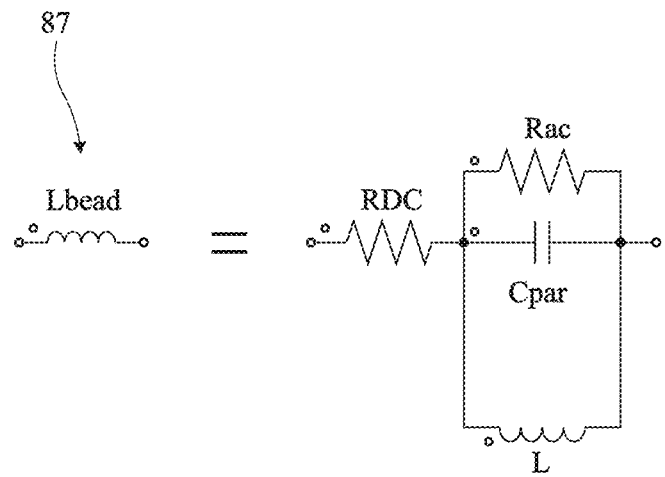
FIG. 7 shows an equivalent electric diagram of a ferrite bead.

FIG. 7 shows the equivalent electric diagram of a ferrite bead.

A ferrite bead may be symbolized by an inductance Lbead. Inductance Lbead is actually equivalent to a resistor Rdc in series with a parallel association of an inductance L, of a capacitor Cpar, and of a resistor Rac, having different contributions according to frequency. In particular, the behavior of the ferrite bead is different according to the frequency with respect to the resonance frequency conditioned by inductance L and capacitance Cpar.

A ferrite bead is an element ensuring a filtering function, which differentiates it from an inductive storage element. A ferrite bead is current used to decrease (filter) high-frequency electromagnetic noise (greater than some ten, or even hundred MHz) over cables. Advantage is taken, in the described embodiments, of this filtering function of a ferrite bead.

Figure 8:
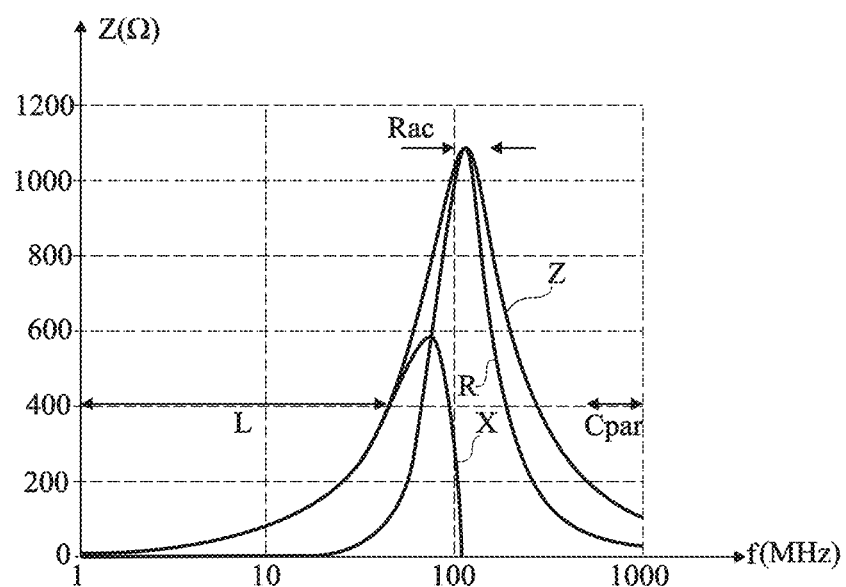
FIG. 8 illustrates an example of a frequency response of a ferrite bead.

FIG. 8 illustrates the frequency response of an example of a ferrite bead.

FIG. 8 shows an example of shape of the impedance (in ohms) provided by ferrite bead 87 according to frequency f (in MHz). Three curves R, X, and Z are present in FIG. 8, curves X and R respectively representing the real and imaginary portions of the impedance illustrated by curve Z.

The behavior (in impedance) of a ferrite bead according to frequency may be summed up as follows:
  around its resonance frequency, it behaves as a resistor of high value (in the shown example in the order of one kilo-ohm) mainly conditioned by the equivalent small-signal resistance value Rac;
  before the resonance (for frequencies smaller than the resonance frequency), it mainly behaves as an inductive element of value L; and
  after the resonance (for frequencies greater than the resonance frequency), it mainly behaves as a capacitive element of value Cpar.

It can thus be seen that by selecting a ferrite bead having a resonance frequency close to the equivalent frequency of the current edges flowing through transistors HM and LM, the latter fictitiously isolates terminals 75 and 77 by its strongly resistive behavior and thus attenuates the effect induced by overvoltages across parasitic inductance Lss during switchings. However, due to the low-frequency inductive behavior, the ferrite bead does not prevent the power transfer from terminal 75 to terminal 77 between switchings.

Figure 9:
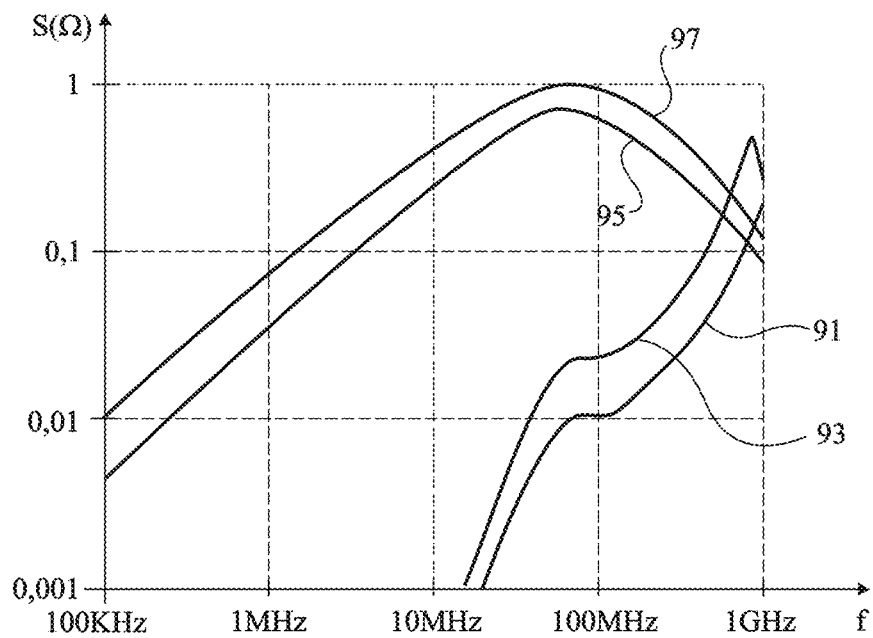
FIG. 9 illustrates the susceptibility of the control voltage of a transistor of the circuit of FIG. 4.

FIG. 9 illustrates the susceptibility of the control voltage of a transistor of the circuit of FIG. 4.

More particularly, FIG. 9 shows as an example the variation of the electric susceptibility of the gate-source voltage of a transistor of a circuit formed according to FIG. 4 and of a circuit where terminals 75 and 77 are directly coupled, according to the frequency of the disturbances introduced by parasitic inductance Lss of connection of sources SH and SL. Susceptibility S and frequency f are in logarithmic scales. Two curves 91 and 93 illustrate the susceptibility of the circuit of FIG. 4 for a parasitic inductance Lss respectively in the order of 15 nH (curve 91) and in the order of 30 nH (curve 93). Two curves 95 and 97 illustrate the frequency susceptibility of the circuit with a direct connection between terminals 75 and 77 and a parasitic inductance Lss respectively in the order of 15 nH (curve 95) and in the order of 30 nH (curve 97).

As appears from these curves, in the absence of a ferrite bead, at frequencies in the order of 100 MHz, the oscillations on the gate would cause destructions of the gates and/or parasitic restarts. Indeed, the sensitivity in the order of one ohm causes a voltage of a plurality of volts under the effect of parasitic currents of a plurality of amperes. With ferrite bead 87, the susceptibility is only in the order of some hundred milliohms, which limits the impact on the gates to voltages in the order of some hundred millivolts, insufficient to restart a transistor.

It could have been devised to couple terminals 75 and 77 with a resistor in series with a diode to transpose the solution of FIG. 3. However, the resistance value which should then be provided (in the order of some hundred ohms) would permanently introduce too large a potential difference between terminals 75 and 77. Due to the ferrite bead, a resistance 85 of low value (a few ohms) in steady state may be provided, while having a resistance in the order of one kilo-ohms during switchings.

It should be noted that, in the described embodiments, the ferrite bead is placed, with respect to the transistor gates, upstream of gate drivers 5H and 5L.

The selection of the ferrite bead depends on the application and on the characteristics of the assembly.

Such a determination may be empirically performed by trying different ferrite beads. However, preferably, certain characteristics of the assembly are rather estimated to ease the selection of the ferrite bead.

In particular, an estimation of the switching edges (dI/dt) provides an approximation of the resonance desired for the ferrite. Such a dI/dt can be deduced from data characteristic of the transistors and of the drivers such as the rise and fall times. The available range of resonance frequency values of the ferrite beads (which extends from approximately 10 MHz to approximately 1 GHz) provides a sufficient choice according to the specific constraints of the circuit.

In addition to the advantages of providing a power supply of the two circuits 5H and 5L from a single voltage source and with no galvanic isolation, an advantage induced by the described assembly is that it enables to dampen drain-source current oscillations during switchings. This decreases oscillations at the level of the gate-source and drain-source voltages of the transistors. This takes part in improving the response to electromagnetic disturbances and enables to avoid using dedicated circuits.

Figure 10:
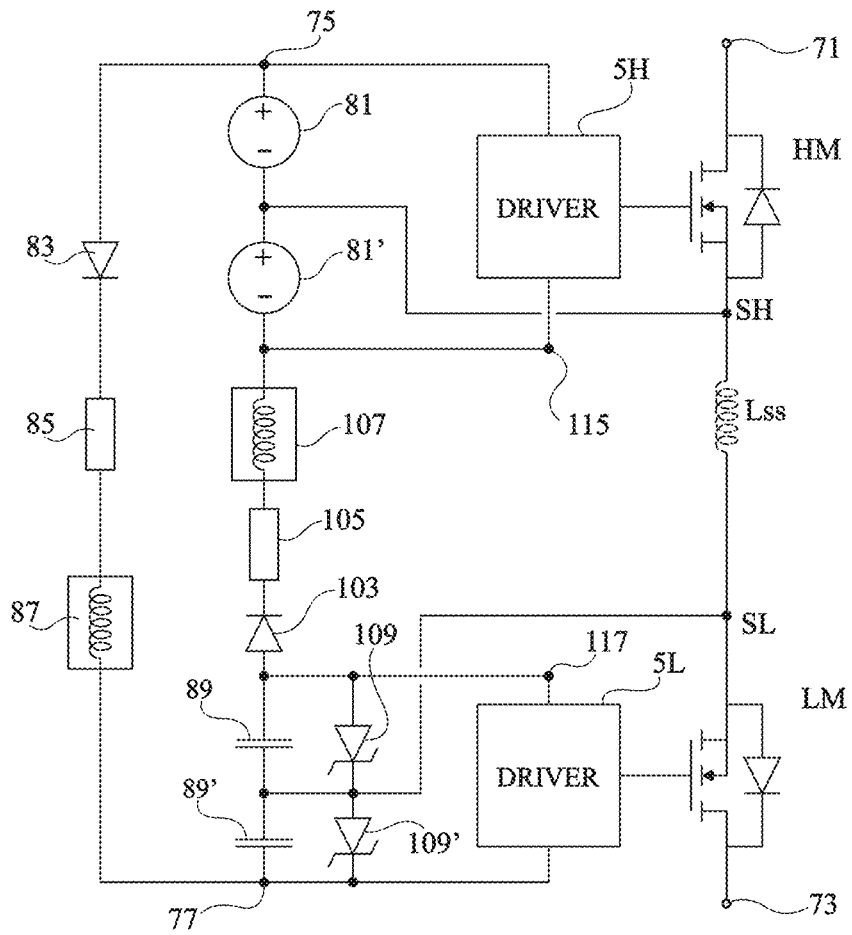
FIG. 10 shows another embodiment of an assembly for powering drivers of two transistors in series.

FIG. 10 shows another embodiment of an assembly for powering drivers of two transistors in series, applied to a power supply having a double polarity (positive and negative).

As compared with the assembly of FIG. 4, circuit 5H is powered with a voltage delivered by two voltage sources 81 and 81' in series between power supply terminals 75 and 115 of circuit 5H. Their junction point is coupled, preferably connected, to source SH of transistor HM. The source of transistor LM is coupled, preferably connected, to the junction point of two capacitors 89 and 89' between power supply terminals 117 and 77 of circuit 5L. Their junction point is coupled, preferably connected, to source SL of transistor LM. Each capacitor 89, 89' is in parallel with a zener diode 109, respectively 109', setting the voltage thereacross, in case of overvoltages.

A first bootstrap assembly, formed of a diode 83, of a resistor 85, and of a ferrite bead 87 (here symbolized by an inductive element) couples terminals 75 and 77 as in FIG. 4, the anode of diode 83 being on the side of terminal 75. A second bootstrap assembly, formed of a diode 103, of a resistor 105, and of a ferrite bead 107, couples terminals 115 and 117, the anode of diode 103 being on the side of terminal 117.

The operation and the sizing of the assembly of FIG. 10 can be deduced from the operation and from the sizing discussed in relation with the embodiment of FIG. 4.

The described embodiments can be easily transposed to the powering of drivers of a voltage inverter where certain switches comprise transistors with a common source which should be controlled in alternated conduction.

More generally, the described embodiments transpose to any assembly for powering, by means of a single voltage source, two gate drivers of transistors in series between two terminals, one at least of which is at a floating potential.

Various embodiments and variations have been described. It will be understood by those skilled in the art that certain features of these various embodiments and variations may be combined, and other variations will occur to those skilled in the art. In particular, although the embodiments have been described in relation with N-channel MOS transistors, shown in the form of enhancement transistors, they easily transpose to the use of depletion MOS transistors or of P-channel transistors with common drains. Similarly, the described embodiments transpose to the use of any type of voltage-controlled switches, for example, of insulated gate bipolar transistor (IGBT) type assembled head-to-tail (with common emitters or with common collectors).

Finally, the practical implementation of the described embodiments and variations is within the abilities of those skilled in the art based on the functional indications given hereabove, in particular as concerns the selection of the ferrite bead and the sizing of the other circuit components according to the application.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An assembly for powering a first circuit, comprising at least one ferrite bead in series with a diode between a first terminal of application of a first voltage and a first terminal of said first circuit, wherein the ferrite bead has a resonance frequency approximately corresponding to a frequency of current edges provided by the first circuit.

2. The assembly of claim 1, wherein the ferrite bead ensures a filtering function at frequencies greater than 10 MHz, preferably greater than 100 MHz.

3. The assembly of claim 1, wherein at least one capacitor couples said first terminal of the first circuit to a second terminal of the first circuit.

4. The assembly of claim 1, wherein the first voltage is delivered by a voltage source.

5. The assembly of claim 1, forming a bootstrap assembly.

6. The assembly of claim 1, further comprising a resistor in series with the ferrite bead and the diode.

* * * * *